United States Patent
Hong

[11] Patent Number: 6,114,733
[45] Date of Patent: Sep. 5, 2000

[54] SURFACE PROTECTIVE LAYER FOR IMPROVED SILICIDE FORMATION

[75] Inventor: Qi-Zhong Hong, Dallas, Tex.

[73] Assignee: Texas Instruments Incorporated, Dallas, Tex.

[21] Appl. No.: 09/395,257

[22] Filed: Sep. 13, 1999

Related U.S. Application Data

[63] Continuation of application No. 08/957,808, Oct. 24, 1997, Pat. No. 6,037,254.

[51] Int. Cl.[7] .............................. H01L 29/78; H01L 33/00
[52] U.S. Cl. ............................................. 257/384; 257/344
[58] Field of Search ...................................... 257/384, 344

[56] References Cited

U.S. PATENT DOCUMENTS

| | | |
|---|---|---|
| 5,395,781 | 3/1995 | Wilhoit . |
| 5,506,158 | 4/1996 | Eklund . |
| 5,710,076 | 1/1998 | Dai et al. . |

OTHER PUBLICATIONS

Sze, *Semiconductor Devices*, p. 377, 1985.

Primary Examiner—Stephen D. Meier
Attorney, Agent, or Firm—Jacqueline J. Garner; Wade James Brady, III; Frederick J. Telecky, Jr.

[57] ABSTRACT

Method of fabricating a narrow linewidth transistor having a low sheet resistance. The transistor may be fabricated in a surface of a semiconductor layer (12). A gate body (14) may be formed separated from an outer surface (16) of the semiconductor layer (12) by a gate insulator (18). The gate body (14) may have an inner surface (20) proximate to the semiconductor layer (12) and an opposite outer surface (22). An insulator layer (30) may be deposited outwardly of the semiconductor layer (12) and the gate body (14). The insulator layer (30) may be anisotropically etched to form side walls (32) adjacent to the gate body (14). The anisotropic etch may cause a residual layer of contaminants (34) to form on the outer surface (16) of the semiconductor layer (12) and on the outer surface (22) of the gate body (14). A protective layer (50) may be deposited outwardly of the residual layer of contaminants (34). Dopants may be implanted into the semiconductor layer (12) proximate to the side walls (32). The semiconductor layer (12) may then be thermally treated to activate the dopants. The protective layer (50) may thereafter be removed and a metal layer (60) deposited outwardly of the semiconductor layer (12) and the gate body (14). A silicide layer (70) may be formed by interacting the metal layer (60) with the outer surface (16) of the semiconductor layer (12) and with the outer surface (22) of the gate body (14).

15 Claims, 2 Drawing Sheets

SURFACE PROTECTIVE LAYER FOR IMPROVED SILICIDE FORMATION

This application is a continuation of 08/957,808 filing date Oct. 24, 1997 now U. S. Pat. No. 6,037,254.

RELATED APPLICATIONS

This application is related to copending U.S. application Ser. No.08/957,171, entitled "COMBINED DRY AND WET ETCH FOR IMPROVED SILICIDE FORMATION" (Attorney's Docket No. TI-21419) now U.S. Pat. No. 6,046,113.

TECHNICAL FIELD OF THE INVENTION

This invention relates generally to the field of electronic devices and more particularly to a surface protective layer for improved silicide formation and to a method of forming the same.

BACKGROUND OF THE INVENTION

Electronic equipment such as televisions, telephones, radios and computers are often constructed of solid state devices. Solid state devices operate based on the movement of charge carriers. Accordingly, solid state devices have no moving parts.

Solid state devices are generally preferred in electronic equipment because they are extremely reliable, very small and relatively inexpensive. Solid state devices may be transistors, capacitors, resistors and the like. Such devices are often formed as part of an integrated circuit.

Increasingly, solid state devices are made smaller to reduce the size of electronic equipment. For a transistor, the smaller size compels a narrow gate. The gate controls the flow of current through the transistor. Reducing the width of the gate, however, usually increases the sheet resistance of the transistor. Such an increase in the sheet resistance deteriorates the performance of the transistor.

SUMMARY OF THE INVENTION

Accordingly, a need has arisen in the art for an improved transistor. The present invention provides a narrow linewidth transistor having a low sheet resistance.

In accordance with the present invention, a transistor may be fabricated in a surface of a semiconductor layer. A gate body may be formed separated from an outer surface of the semiconductor layer by a gate insulator. The gate body may have an inner surface proximate to the semiconductor layer and an opposite outer surface. An insulator layer may be deposited outwardly of the semiconductor layer and the gate body. The insulator layer may be anisotropically etched to form side walls adjacent to the gate body. The anisotropic etch may cause a residual layer of contaminants to form on the outer surface of the semiconductor layer and on the outer surface of the gate body. A protective layer may be deposited outwardly of the residual layer of contaminants. Dopants may be implanted into the semiconductor layer proximate to the side walls. The semiconductor layer may then be thermally treated to activate the dopants. The protective layer may thereafter be removed. A metal layer may be deposited outwardly of the semiconductor layer and of the gate body. A silicide layer may be formed by interacting the metal layer with the outer surface of the semiconductor layer and with the outer surface of the gate body.

Important technical advantages of the present invention include providing a narrow linewidth transistor having a low sheet resistance. In particular, the transistor may be fabricated with nickel or cobalt silicide having a relatively low sheet resistance at narrow linewidths.

Another technical advantage of the present invention includes providing a protective layer for improved silicide formation. In particular, the protective layer may be deposited prior to thermal treatment to prevent contaminants from being altered by ambient gas at high temperatures to later interfere with silicide formation.

Other technical advantages will be readily apparent to one skilled in the art from the following figures, descriptions, and claims.

BRIEF DESCRIPTION OF THE DRAWINGS

For a more complete understanding of the present invention and its advantages thereof, reference is now made to the following description taken in conjunction with the accompanying drawings, wherein like referenced numerals represent like parts, in which.

DETAILED DESCRIPTION OF THE INVENTION

The preferred embodiments of the present invention and its advantages are best understood by referring now in more detail to FIGS. 1A–H of the drawings, in which like numerals refer to like parts throughout the several views. FIGS. 1A–H illustrate a method of fabricating a transistor using a surface protective layer to improve silicide formation. As described in more detail below, the surface protective layer enables fabrication of a narrow linewidth transistor having low sheet resistance.

Figure 1A:
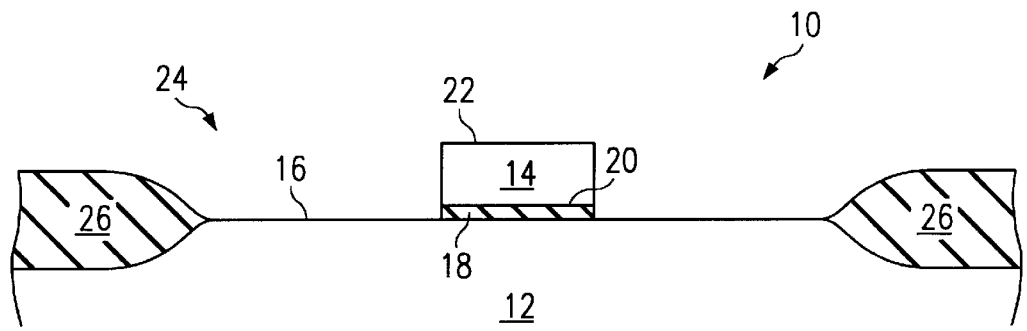
FIGS. 1A–I are a series of schematic cross-sectional diagrams illustrating one embodiment of a method of fabricating a transistor in accordance with the present invention.

FIG. 1A shows an initial semiconductor structure 10 for constructing the narrow linewidth transistor. The initial semiconductor structure 10 may have a semiconductor layer 12 and a gate body 14. The semiconductor layer 12 may be substrate such as a wafer. It will be understood that the semiconductor layer 12 may also be a layer of semiconductor material formed on a substrate. For example, the semiconductor layer 12 may be an epitaxial layer grown on a wafer.

In one embodiment, the semiconductor layer 12 may be a (p)-type silicon substrate. In this embodiment, the semiconductor layer 12 may comprise a single-crystalline silicon material that has been slightly doped with a (p)-type dopant such as boron. It will be understood that the present invention may be used with an (n)-type semiconductor substrate or layer.

The gate body 14 may be separated from an outer surface 16 of the semiconductor layer 12 by a gate insulator 18. The gate body 14 may have an inner surface 20 adjacent to the gate insulator 18 and an opposite outer surface 22. The gate body 14 may comprise polycrystalline silicon or other suitable semiconductor material. The gate insulator 18 may comprise silicon dioxide or other suitable insulator material.

The gate body 14 and the gate insulator 18 may be formed in a window 24 between field oxide 26. The window 24 may be formed using conventional photolithography techniques associated with pattern and etching. The field oxide 26 may be formed as a result of a local oxidation process. In one embodiment, the gate body 14 may have a linewidth of less than five (5) micrometers ($\mu$m). This small size allows the transistor to be used in miniaturized circuits that demand extremely small solid state devices.

Figure 1B:
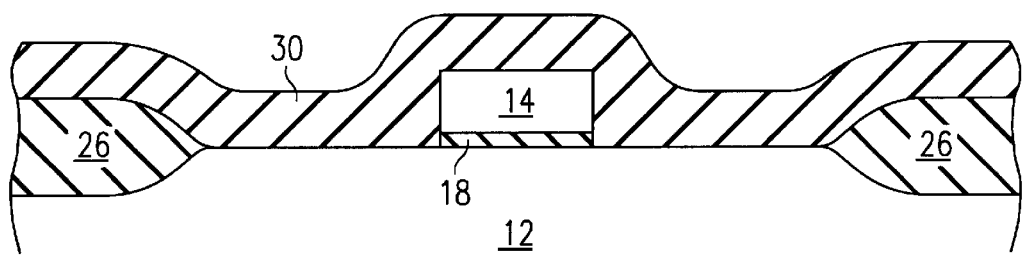

Referring to FIG. 1B, an insulator layer 30 may be deposited outwardly of the semiconductor layer 12 and the gate body 14. As shown by FIG. 1B, the insulator layer 30 may be deposited directly onto the semiconductor layer 12 and the gate body 14. The insulator layer 30 may be an oxide layer conventionally made of silicon dioxide. It will be understood that the insulator layer 30 may comprise other materials capable of insulating semiconductor elements.

Figure 1C:
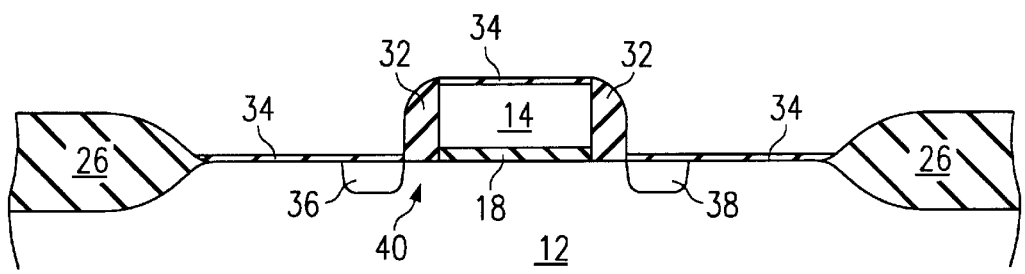

Referring to FIG. 1C, the insulator layer 30 may be anisotropically etched to form a pair of side walls 32. The anisotropic etch is conventionally a reactive ion etch (RIE) using carbon fluorine-based gases such as $CF_4$ and/or $CHF_3$. The side walls 32 electrically isolate ends of the gate body 14 from other elements of the transistor.

The anisotropic etch may leave a residual layer of contaminants 34 on the outer surface 16 of the semiconductor layer 12 and on the outer surface 34 of the gate body 14. To remove the residual layer of contaminants 34, the semiconductor structure may be cleaned by immersion in an acid bath or the like. Such cleaning, however, removes only some of the contaminants. As a result, the residual layer of contaminants 34 remains on the outer surface 16 of the semiconductor layer 12 and on the outer surface 22 of the gate body 14 after cleaning.

The residual layer of contaminants 34 may become altered by temperature and/or exposure to various gases during thermal treatment. Thermal treatment may be used to activate and/or diffuse dopants implanted into the semiconductor layer 12. The alteration of the contaminants 34 interferes with silicide formation and leads to high sheet resistance of the source, drain and gate.

The present invention solves this problem by providing a surface protective layer. As described in more detail below, the protective layer may be deposited prior to thermal processing and removed after such processing. Accordingly, the protective layer covers the residual layer of contaminants 34 during thermal processing to prevent the contaminants 34 from being altered by high temperature exposure to various gases. As a result, the unaltered contaminants 34 do not later interfere with silicide formation to cause an increase in sheet resistance of the transistor.

In one embodiment, the protective layer may be deposited after implantation of dopants into the semiconductor layer 12. It will be understood, however, that the protective layer may be deposited prior to implantation of the dopants. The dopants may be implanted into a conductive source region 36 and a conductive drain region 38 of the semiconductor layer 12. The side wall 32 proximate to the conductive source region 36 may be a source side insulator body. The side wall 32 proximate to the conductive drain region may be a drain side insulator body. The conductive source region 36 and the conductive drain region 38 may be spaced opposite one another and apart from the gate body 14 to define a channel region 40 in the semiconductor layer 12. The channel region 40 may be disposed inwardly of the gate insulator 18.

Figure 1D:
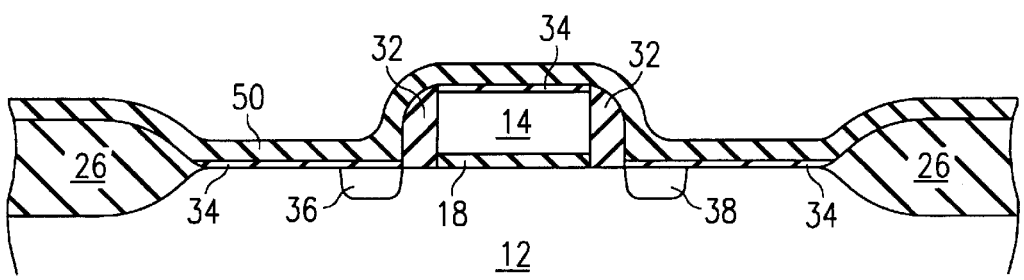

Referring to FIG. 1D, the protective layer 50 may be deposited outwardly of the residual layer of contaminants 34. In one embodiment, the protective layer 50 may be deposited directly onto the semiconductor layer 12, the side walls 32 and the gate body 14 to completely cover the residual layer of contaminants 34. The protective layer 50 may be a thin layer of tetraethylorthosilicate (TEOS) or oxide such as silicon dioxide. It will be understood that the protective layer 50 may include other and different types of materials capable of covering and protecting the contaminants 34 during thermal treatment. For an embodiment comprising silicon dioxide, the protective layer 50 may be on the order of 100–250 angstroms in thickness.

Figure 1E:
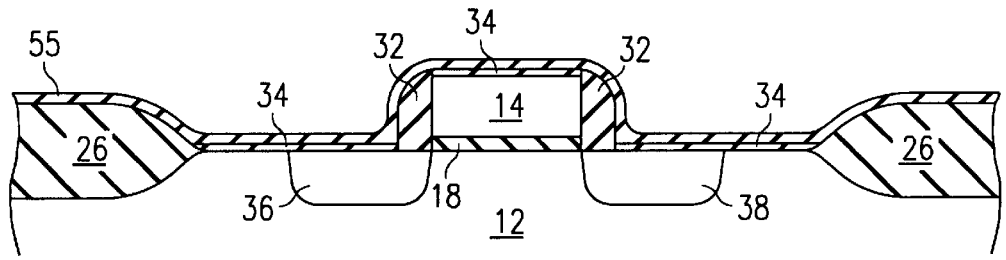

With the protective layer 50 covering the contaminants 34, the semiconductor structure may be thermally treated to activate the dopants implanted in the conductive source and drain regions 36 and 38. During thermal treatment, the dopants may diffuse at a known rate in the semiconductor layer 12. The dopants diffuse by spreading through the semiconductor layer 12. As shown by FIG. 1E, the dopants may expand the conductive source region 36 and the conductive drain region 38 to define the channel 40 directly under the gate insulator 18.

In one embodiment, the thermal treatment may be rapid thermal processing (RTP). Rapid thermal processing exposes the semiconductor structure to a high temperature for a short period of time. In this embodiment, the semiconductor structure may be placed in a high temperature furnace and exposed to temperatures in excess of 900° Celsius for five or more seconds. In the furnace, the semiconductor structure may also be exposed to an ambient gas comprising nitrogen ($N_2$). It will be understood that the thermal treatment may involve disparate temperatures, time periods and/or ambient gases. For example, the thermal treatment may proceed at a lower temperature for a greater length of time. In this embodiment, the semiconductor structure may be exposed to a temperature of about 500° Celsius or greater for twenty (20) or more minutes.

Following thermal treatment, the protective layer 50 may be removed from the semiconductor structure. In one embodiment, the protective layer 50 may be removed by a combination wet and dry etch as described in related U.S. patent application Ser. No. 08/957,171, entitled "Combined Wet and Dry Etch for Improved Silicide Formation." In this embodiment, a dry anisotropic etch may be used to remove approximately 75% of the protective layer 50. A wet isotropic etch may then be used to remove the remaining portion of the protective layer 50.

The dry anisotropic etch is conventionally a reactive ion etch (RIE) using carbon fluorine-based gases such as $CF_4$ and/or $CHF_3$. Because the dry etch is anisotropic, it will not attack the side walls 32. As previously described, however, the dry anisotropic etch would leave contaminants on the outer surface 16 of the semiconductor layer 12 and on the outer surface 22 of the gate body 14 if allowed to etch away the entire protective layer 50. Accordingly, the wet isotropic etch is used to remove the remaining portion of the protective layer 50. As a result, the contaminants left by the partial dry anisotropic etch are removed with the remaining portion of the protective layer 50. Because the wet isotropic etch is limited in duration, it will not etch the side walls 32 to a point where they are inoperative. Accordingly, the protective layer 50 is removed without adding another layer of residual contaminants. It will be understood that the protective layer 50 may be removed within other etches and the like with the scope of the invention.

Figure 1F:
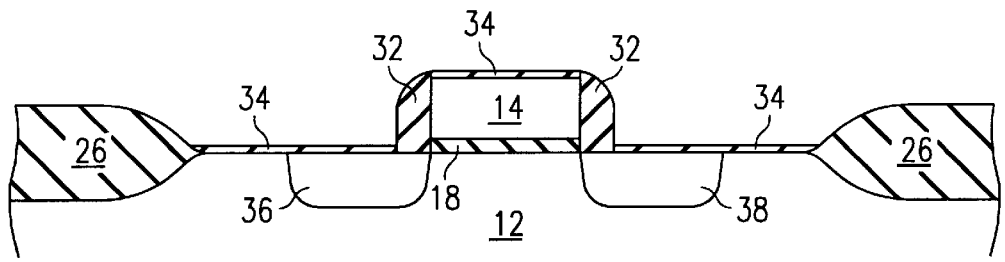

Referring to FIG. 1F, a metal layer 60 may be deposited outwardly of the semiconductor layer 12 and the gate body 14. In one embodiment, the metal layer 60 may be deposited directly onto the semiconductor layer 12, the gate body 14, the side walls 32 and the field oxide 26. The metal layer 60 may comprise nickel, cobalt or other materials capable of forming a silicide layer of low sheet resistance on a narrow linewidth transistor. Preferably, the silicide layer has a sheet resistance of less than 20 ohms per square.

Nickel and cobalt cannot reduce native oxide on silicon and are therefore especially sensitive to alteration of the contaminants 34. Altered contaminants 34 interfere with nickel and cobalt silicide formation to increase sheet resistance of the resulting silicide layer. As previously described, the protective layer 50 of the invention prevents alteration of the contaminants 34. Accordingly, nickel and cobalt may be used to form a silicide layer of a narrow linewidth transistor without undue interference from contaminants.

Figure 1G:
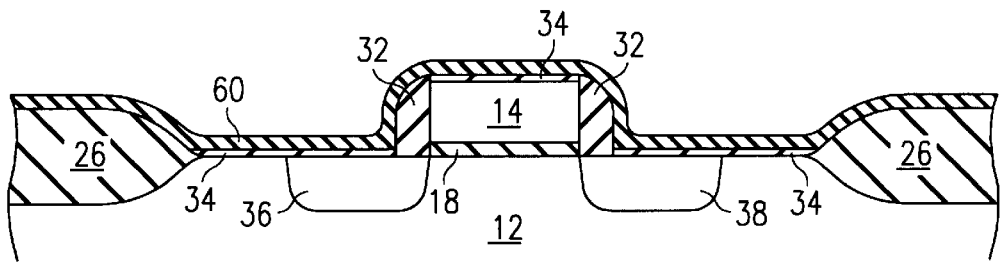

Referring to FIG. 1G, the metal layer 60 may be reacted with adjacent silicon material for silicidation of the metal layer 60 with the silicon. As shown by FIG. 1G, a silicide layer 70 may be interfused to the outer surface 16 of the semiconductor layer 12 and to the outer surface 22 of the gate body 14. The silicide layer 70 dramatically reduces the contact resistance and sheet resistance of the regions. Portions of the metal layer 60 adjacent to non-silicon bodies, such as the side walls 32 and the field oxide 26, will not react to form a silicide layer.

Figure 1H:
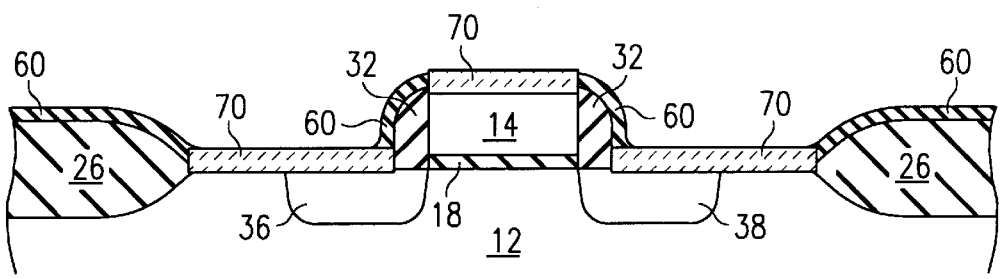

Referring to FIG. 1H, the semiconductor structure may be subjected to an aqua regia etch to remove portions of the metal layer 60 adjacent to non-silicon bodies which did not react to form the silicide layer 70. Conventional techniques can then be used to contact the gate body 14, the conductive source region 36 and the conductive drain region 38 via sections of the silicide layer 70.

In summary, the present invention provides a narrow linewidth transistor having a low sheet resistance and a method of fabricating that transistor. The transistor may be fabricated in accordance with the invention by forming a gate body separated from an outer surface of a semiconductor layer by a gate insulator. The gate body may have an inner surface proximate to the semiconductor layer and an opposite outer surface. An insulator layer may be deposited outwardly of the semiconductor layer and the gate body. The insulator layer may be anisotropically etched to form side walls adjacent to the gate body. The anisotropic etch may cause a residual layer of contaminants to form on the outer surface of the semiconductor layer and on the outer surface of the gate body. A protective layer may be deposited outwardly of the residual layer of contaminants. Dopants may be implanted into the semiconductor layer proximate to the side walls. The protective layer covers the residual of contaminants during layer thermal processing to prevent the contaminants from being altered such that they interfere with later silicide formation.

Figure 1I:
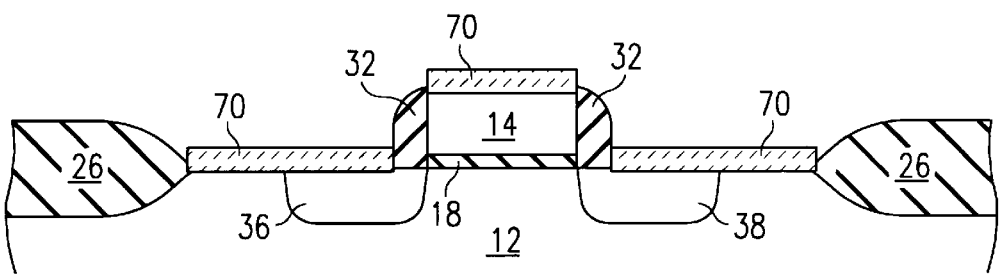

With the protective layer in place, the semiconductor layer may be thermally treated to activate the dopant. The protective layer may then be removed. A metal layer may be deposited outwardly of the semiconductor layer and the gate body. A silicide layer may be formed by interacting the metal layer with the outer surface of the semiconductor layer and with the outer surface of the gate body. The transistor then appears as shown in FIG. 1I after excess metal is removed.

Although the present invention has been described with several embodiments, various changes and modifications may be suggested to one skilled in the art. It is intended that the present invention encompass such changes and modifications as fall within the scope of the appended claims.

What is claimed is:

1. A partially fabricated semiconductor device, comprising:

a semiconductor layer having an outer surface;

a gate body separated from said outer surface of said semiconductor layer by a gate insulator;

the gate body having an inner surface proximate to the semiconductor layer and an opposite outer surface;

a conductive source region formed in the outer surface of the semiconductor layer and spaced apart from the gate body;

a conductive drain region formed in the outer surface of the semiconductor layer and spaced apart from the gate body opposite the conductive source region to define a channel region in the semiconductor layer disposed inwardly of the gate insulator;

a source side insulator body formed adjacent the gate body proximate to the conductive source region;

a drain side insulator body formed adjacent the gate body proximate to the conductive drain region;

thermally alterable contaminants from prior fabrication steps which have been present during processing at temperatures which would cause alteration of said contaminants and which are substantially unaltered so that said contaminants remain inert to cobalt and cobalt silicide disposed on said outer surface of said semiconductor layer;

a nickel silicide layer interfused to the outer surface of the gate body, said unaltered contaminants and to the outer surface of the semiconductor layer proximate to the conductive source and drain regions; and the nickel silicide layer having a sheet resistance of less than 20 ohms per square.

2. The semiconductor device of claim 1, further comprising the gate body having a linewidth of less than 0.5 $\mu$m.

3. The semiconductor device of claim 1, wherein the gate body comprises polysilicon.

4. A partially fabricated semiconductor device, comprising:

semiconductor layer having an outer surface;

a gate body separated from an outer surface of said semiconductor layer by a gate insulator;

the gate body having an inner surface proximate to the semiconductor layer and an opposite outer surface;

a conductive source region formed in the outer surface of the semiconductor layer and spaced apart from the gate body;

a conductive drain region formed in the outer surface of the semiconductor layer and spaced apart from the gate body opposite the conductive source region to define a channel region in the semiconductor layer disposed inwardly of the gate insulator;

a source side insulator body formed adjacent the gate body proximate to the conductive source region;

a drain side insulator body formed adjacent the gate body proximate to the conductive drain region;

thermally alterable contaminants from prior fabrication steps which have been present during processing at temperatures which would cause alteration of said contaminants and which are substantially unaltered so that said contaminants remain inert to cobalt and cobalt silicide disposed on said outer surface of said semiconductor layer;

a cobalt silicide layer interfused to the outer surface of the gate body, said unaltered contaminants and to the outer surface of the semiconductor layer proximate to the conductive source and drain regions; and the cobalt silicide layer having a sheet resistance of less than 20 ohms per square.

5. The semiconductor device of claim 4, further comprising the gate body having a linewidth of less than 0.5 $\mu$m.

6. The semiconductor device of claim 4, wherein the gate body comprises polysilicon.

7. A semiconductor device, comprising:

a semiconductor layer having an outer surface;

a gate body separated from said outer surface of said semiconductor layer by a gate insulator;

the gate body having an inner surface proximate to the semiconductor layer and an opposite outer surface;

thermally alterable contaminants from prior fabrication steps which have been present during processing at temperatures which would cause alteration of said contaminants and which are substantially unaltered so that said contaminants remain inert to cobalt and cobalt silicide disposed on said outer surface of said semiconductor layer;

a conductive source region disposed in the outer surface of the semiconductor layer and spaced apart from the gate body;

a conductive drain region formed in the outer surface of the semiconductor layer and spaced apart from the gate body opposite the conductive source region to define a channel region in the semiconductor layer disposed inwardly of the gate insulator;

a source side insulator body formed adjacent the gate body proximate to the conductive source region;

a drain side insulator body formed adjacent the gate body proximate to the conductive drain region;

unaltered contaminants resulting from fabrication of each of the above-mentioned elements which are inert to one of nickel and nickel silicide or cobalt and cobalt silicide disposed on said outer surface of said semiconductor layer; and a layer of said one of a nickel silicide or cobalt silicide interfused to the outer surface of the gate body and to the outer surface of the semiconductor layer proximate to the conductive source and drain regions.

8. The semiconductor device of claim 7, further comprising the gate having a linewidth of less than 0.5 µm.

9. The semiconductor device of claim 7, wherein the gate body comprises polysilicon.

10. The semiconductor device of claim 7, wherein said one of cobalt silicide or nickel silicide layer has a sheet resistance of less than 20 ohms per square.

11. The semiconductor device of claim 8, wherein said one of cobalt silicide or nickel silicide layer has a sheet resistance of less than 20 ohms per square.

12. The semiconductor device of claim 9, wherein said one of cobalt silicide or nickel silicide layer has a sheet resistance of less than 20 ohms per square.

13. A semiconductor device fabricated by a method of fabricating a transistor in a surface of a semiconductor layer, comprising the steps of:

forming a gate body separated from an outer surface of the semiconductor layer by a gate insulator, the gate body having an inner surface proximate to the semiconductor layer and an opposite outer surface;

depositing an insulator layer over the semiconductor layer and the gate body;

anisotropically etching the insulator layer to form side walls on said gate body and causing a residual layer of contaminants to form on the outer surface of the semiconductor layer and on the outer surface of the gate body;

non-thermally depositing a protective layer outwardly of the residual layer of contaminants;

implanting a dopant into the semiconductor layer proximate to the side walls;

then thermally treating the semiconductor layer to activate the dopant;

then removing the protective layer;

depositing a metal layer outwardly of the semiconductor layer and the gate body; and forming a silicide layer by interacting the metal layer with the outer surface of the semiconductor layer and with the outer surface of the gate body.

14. The device of claim 13, wherein said gate body is a polysilicon body, wherein the polysilicon body has a linewidth of less than 0.5 µm.

15. The device of claim 13, wherein said gate body is a polysilicon body, wherein the polysilicon body has a linewidth of less than 0.4 µm.

* * * * *